United States Patent [19]

Onishi et al.

[11] Patent Number: 5,293,075
[45] Date of Patent: Mar. 8, 1994

[54] SEMICONDUCTOR DEVICE WITH PZT/PLZT FILM AND LEAD-CONTAINING ELECTRODE

[75] Inventors: Shigeo Onishi, Nara; Kazuya Ishihara, Tenri; Keizo Sakiyama, Kashihara, all of Japan

[73] Assignee: Sharp Kabushiki Kaisha, Osaka, Japan

[21] Appl. No.: 890,230

[22] Filed: May 29, 1992

[30] Foreign Application Priority Data

Sep. 3, 1991 [JP] Japan .................. 3-222928

[51] Int. Cl.$^5$ .................. H01L 29/400; H01L 27/108
[52] U.S. Cl. .................. 257/769; 257/310
[58] Field of Search .................. 257/295, 298, 310, 768, 257/751, 769; 365/145, 149

[56] References Cited

U.S. PATENT DOCUMENTS 5,046,043  9/1991  Miller et al. .................. 257/298
5,099,305  3/1992  Takenaka .................. 257/295

OTHER PUBLICATIONS

Spierings et al., Preparation and Ferroelectric Properties of $PbZr_{0.53}Ti_{0.47}O_3$ thin films by Spin Coating and Metalorganic Decomposition, J. Appl. Phys., vol. 70, No. 4, Aug. 15, 1991, pp. 2290-2298.

*Primary Examiner*—Rolf Hille
*Assistant Examiner*—Peter Toby Brown
*Attorney, Agent, or Firm*—Nixon & Vanderhye

[57] ABSTRACT

A semiconductor device comprising an oxide film, an electrode and a PZT or PLZT film formed in this order on a substrate, the electrode being a deposit of platinum containing lead.

3 Claims, 2 Drawing Sheets

SEMICONDUCTOR DEVICE WITH PZT/PLZT FILM AND LEAD-CONTAINING ELECTRODE

BACKGROUND OF THE INVENTION

1. Field of the Invention

The invention relates to a semiconductor device, and more particularly to a semiconductor device provided with a ferroelectric PZT or PLZT film.

2. Description of the Related Art

PZT ($Pb-Zr-TiO_3$), PLZT ($Pb-La-Zn-TiO_3$) or the like has a perovskite structure represented by the general formula $ABO_3$ and shows a hysteresis effect on an external electric field and a very high dielectric constant. Such materials are actively utilized as a capacitor dielectric film for semiconductor devices such as large-scale DRAMs and non-volatile memory devices.

A principal portion of a conventional non-volatile, memory device having a PZT film is exemplified with reference to FIG. 2(c) as attached herein.

In FIG. 2, 1 is a substrate made of silicon and having thereon an oxide film 2 of $SiO_2$. A platinum thin film is layered on the $SiO_2$ film 2, forming an electrode 7 on which a PZT film 6 is deposited.

A preparing method of the semiconductor device as above is as follows.

Silicon halide or hydride is hydrolyzed or oxidized or organic oxysilane is thermally decomposed to form the $SiO_2$ film on the silicon substrate 1 and platinum is then deposited 1000 to 2000Å on the $SiO_2$ film 2 by a DC magnetron sputtering method using a platinum target to form the electrode 7 (FIG. 2(a)).

PZT is deposited 2000 to 3000Å in thickness on the electrode 7 by a RF sputtering method using a plasma ion of $Ar/O_2$ preferably with a sintered PZT target of Ti, Zr and Pb in the ratio of 0.5:0.5:1.15 under reduced pressure to form the PZT film 4 (FIG. 2(b)).

The silicon substrate 1 having thereon the $SiO_2$ film 2, electrode 7 and PZT film 4 is annealed for 30 mins to 1 hr at 550° to 650°C. in an oxidative atmosphere and then further applied with a separate electrode material in a desired pattern to complete a semiconductor device (not shown).

The semiconductor device uses platinum as the basic electrode 7 and the substrate is annealed after the PZT film 4 is formed on the basic electrode 7. Hence, the annealing causes PbO in the PZT film 4 to readily change to a vapor, leading to that the resultant PZT film 6 lacks Pb, particularly, at an interface between the electrode 7 and the PZT film 6. As a result, there is a problem that the PZT film 6 when provided with a space-charge region at the interface between the electrode 7 and the PZT film 6 is poor in reliability or other properties.

SUMMARY OF THE INVENTION

The present invention provides a semiconductor device comprising an oxide film, an electrode and a PZT or PLZT film formed in this order on a substrate, the electrode being a deposit of platinum containing lead.

According to the present invention, it provides a semiconductor device having a PZT or PLZT film being kept uniform in its composition in a vertical direction of the film after annealing.

PREFERRED EMBODIMENTS OF THE INVENTION

The semiconductor device of the present invention comprises an oxide film, an electrode and a PZT or PLZT film formed in this order on a substrate, the electrode being a deposit of platinum containing lead.

The substrate to be employed in the invention is usually a silicon substrate, on which a transistor or capacitor element may be optionally formed beforehand.

The oxide film may be $SiO_2$ film formed by conventional methods, such as hydrolysis or oxidation of a silicon halide or hydride or a thermal decomposition method of an organic oxysilane. Its thickness is preferably about 80 to 150Å.

The electrode to be formed on the oxide film is preferably made of platinum having a lead content of about 5 to 20 wt. %, preferably of about 8 to 20 wt. %, e.g., 8 wt. %, 10 wt. %, 12 wt. %, 15 wt. % or 17 wt. %, which may be formed by conventional methods, such as a DC magnetron sputtering method using a platinum target having a lead content of about 5 to 20 wt. %. Its thickness is preferably about 1000 to 2000Å.

The PZT or PLZT film to be formed on the electrode may be formed by conventional methods, such as a RF sputtering method using a plasma ion of $Ar/O_2$ preferably with a sintered PZT or PLZT target of Ti, Zr and Pb in the ratio of 0.3 to 0.5: 0.5 to 0.7: 1.15 to 1.3 or Ti, Zr, Pb and La in the ratio of about 0.3 to 0.5: 0.5 to 0.7: 1.05 to 1.1: 0.05 to 1.0. Thickness of the PZT or PLZT film is preferably about 2000 to 3000Å.

The substrate after the formation of the PZT or PLZT film is preferably annealed at about 550° to 650° C. for about 30 mins to 1 hr under an oxidative atmosphere

DESCRIPTION OF PREFERRED EMBODIMENTS

Next, an example of the present invention will be detailed with reference to the accompanied drawings.

Figure 1A:
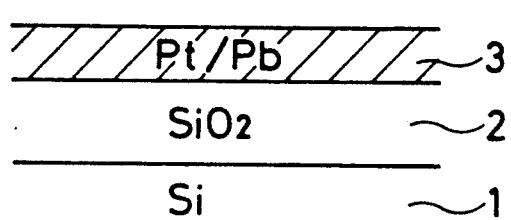
FIGS. 1(a) through 1(c) are schematic diagrams of principal portions of a semiconductor device in production according to the present invention, showing a manufacturing process thereof.
Figure 1B:
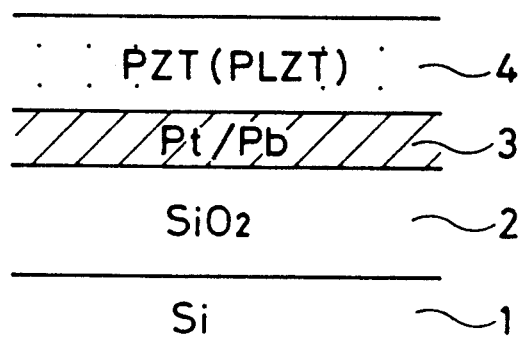
Figure 1C:
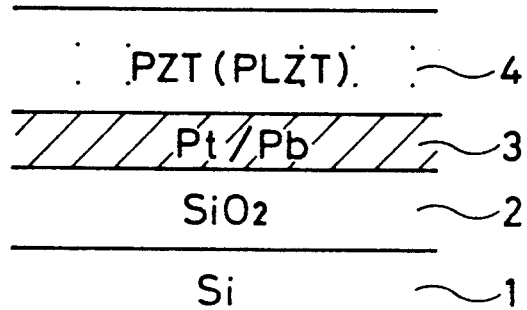

As shown in FIG. 1(c), on a substrate 1 made of silicon are layered in order an oxide film 2 of $SiO_2$, an electrode 3 of Pt/Pb and a PZT film 4.

A manufacturing method of the semiconductor device having the above construction is as follows.

A $SiO_2$ film 2 of about 100Å was formed on the silicon substrate 1, for example, by a thermal decomposition method of an organic oxysilane. A Pt/Pb electrode 3 of about 2000Å was then layered on the $SiO_2$ film 2 by a DC magnetron sputtering method using platinum having a lead content of 10 wt. % (FIG. 1(a)).

A PZT film 4 of about 3000Å was layered on the electrode 3 by a RF sputtering method using a PZT sintered target of Ti, Zr and Pb in the ratio of 0.5: 0.5: 1.15 with a plasma ion of $Ar/O_2$ under reduced pressure (FIG. 1(b)).

The silicon substrate 1 having thereon the $SiO_2$ film 2, Pt/Pb electrode 3 and PZT film 4 was annealed for 30 mins at 600° C. under an oxidative atmosphere (FIG. 1(c)).

A separate electrode material was layered on the substrate and patterned in a desired pattern to complete a semiconductor (not shown).

A ferroelectric memory device provided with the above construction enabled high-speed writing and reading due to its polarization inversion property.

The PZT film may be replaced with a PLZT film which was prepared by a RF sputtering method using a sintered target of Ti, Zr, Pb and La in the ratio of 0.3: 0.1: 1.1: 0.1 and had the same effect as the PZT film.

Figure 2:
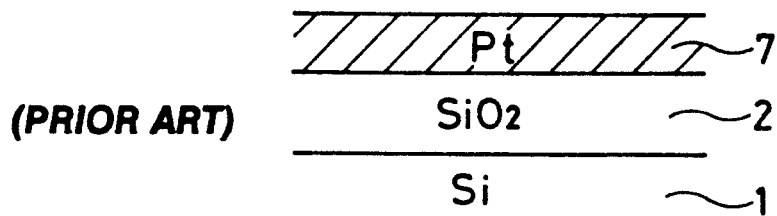
FIGS. 2(a) through 2(c) are schematic diagrams of principal portions of a conventional semiconductor device in production, showing a manufacturing process thereof.
Figure 2:
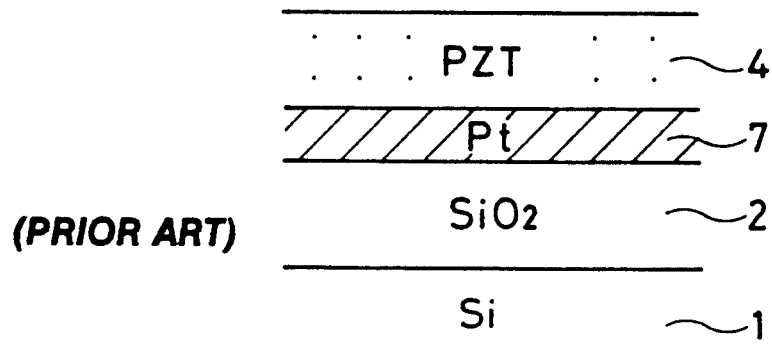
Figure 2:
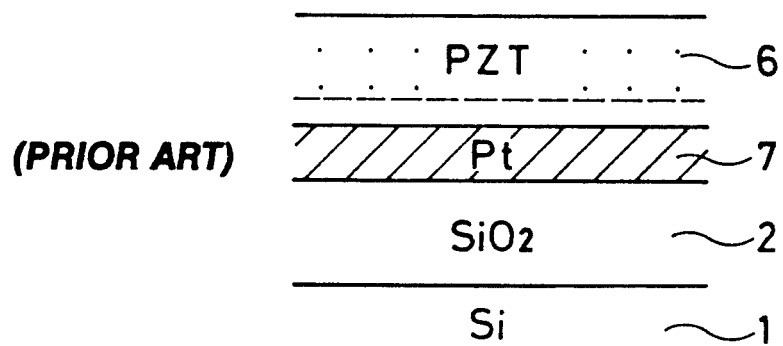

The electrode of the semiconductor device was made of platinum containing lead (Pb) as foregoing. When Pb in the PZT or PLZT film 4 changed to a vapor in the form of PbO in the midst of the device manufacturing process, i.e., upon annealing of the substrate, leading to a lack of Pb as conventionally, particularly, at an interface between the electrode (denoted by 7 in FIG. 2) and the PZT or PLZT film 4, the platinum electrode 3 containing lead Pb supplied to the interface between the electrode 3 and the PZT or PLZT film 4, so that the resultant PZT or PLZT film 4 was uniform in composition in a vertical direction of the film.

Hence, the present invention provides a reliable PZT or PLZT film which is applicable to various semiconductor devices, such as a large-scale DRAM, nonvolatile memory or the like.

What we claimed is:

1. A semiconductor device comprising:
    a substrate;
    an oxide film formed on the substrate;
    an electrode formed on the oxide film; and
    a PZT or PLZT film formed on the electrode;
    the electrode being a deposit of platinum containing lead, wherein said deposit contains 5 to 20 wt. % of lead.

2. A semiconductor device as set forth in claim 1, wherein the electrode is formed by sputtering using platinum containing lead as a target.

3. A semiconductor device comprising:
    a substrate;
    an oxide film formed on the substrate;
    an electrode formed on the oxide film; and
    a PZT or PLZT film formed on the electrode;
    the electrode being a deposit which contains platinum and lead prior to formation of the PZT or PLZT film, wherein said deposit contains 5 to 20 wt. % of lead.

* * * * *